(12) United States Patent
Liu et al.

(10) Patent No.: US 8,487,198 B2
(45) Date of Patent: Jul. 16, 2013

(54) CAPACITIVE TOUCH CONTROL DEVICE AND METHOD THEREOF

(75) Inventors: Chen-Yu Liu, Jhongli (TW); Ching-Yi Wang, Jhongli (TW)

(73) Assignee: TPK Touch Solutions Inc., Taipei (TW)

( * ) Notice: Subject to any disclaimer, the term of this patent is extended or adjusted under 35 U.S.C. 154(b) by 461 days.

(21) Appl. No.: 12/222,614

(22) Filed: Aug. 13, 2008

(65) Prior Publication Data
US 2009/0283340 A1  Nov. 19, 2009

(30) Foreign Application Priority Data
May 13, 2008  (TW) ................................ 97117524 A

(51) Int. Cl.
*G06F 3/044*  (2006.01)
(52) U.S. Cl.
USPC ........................................ 178/18.06; 345/174
(58) Field of Classification Search
USPC ................... 345/173, 174; 178/18.01, 18.05, 178/18.06, 18.07
See application file for complete search history.

(56) References Cited

U.S. PATENT DOCUMENTS

| | | | | |
|---|---|---|---|---|
| 4,758,830 A | * | 7/1988 | Levien et al. | 345/174 |
| 4,839,634 A | * | 6/1989 | More et al. | 345/173 |
| 5,283,556 A | * | 2/1994 | Ise | 345/174 |
| 5,357,266 A | * | 10/1994 | Tagawa | 345/173 |
| 5,633,659 A | * | 5/1997 | Furuhashi et al. | 345/173 |
| 5,825,345 A | * | 10/1998 | Takahama et al. | 345/104 |
| 6,501,529 B1 | | 12/2002 | Kurihara et al. | |
| 6,980,202 B2 | * | 12/2005 | Carro | 345/173 |
| 7,158,129 B2 | * | 1/2007 | Nakajima | 345/207 |
| 7,598,949 B2 | * | 10/2009 | Han | 345/204 |
| 2005/0179672 A1 | * | 8/2005 | Chiu et al. | 345/173 |
| 2005/0219229 A1 | * | 10/2005 | Yamaguchi | 345/173 |
| 2006/0132463 A1 | * | 6/2006 | Lee et al. | 345/173 |
| 2007/0257894 A1 | | 11/2007 | Philipp | |
| 2009/0002326 A1 | * | 1/2009 | Pihlaja | 345/173 |
| 2009/0079707 A1 | * | 3/2009 | Kaehler et al. | 345/174 |

* cited by examiner

*Primary Examiner* — Koosha Sharifi-Tafreshi
(74) *Attorney, Agent, or Firm* — Gokalp Bayramoglu; Anna Tsang

(57) ABSTRACT

Disclosed are a capacitive touch control device and a method thereof. A top face of a substrate is provided with first and second electrode groups, which each include a plurality of strip-like electrodes spaced from each other by a preset distance. The electrodes of the first and second electrode groups are respectively connected by first and second group scanning lines to a scanning circuit. When the first group scanning lines drive the electrodes of the first electrode group, the second group scanning lines carry out scanning operation on the electrodes of the second electrode group, and when the second group scanning lines drive the electrodes of the second electrode group, the first group scanning lines carry out scanning operation on the electrodes of the first electrode group. And, a touch location can thus be determined by using a microprocessor.

6 Claims, 6 Drawing Sheets

| Time | Driving | Scanning |
|---|---|---|
| First Time Interval (t1) | 21、22、23、24、25 | 31、32、33、34、35 |
| Second Time Interval (t2) | 31、32、33、34、35 | 21、22、23、24、25 |

FIG.6

CAPACITIVE TOUCH CONTROL DEVICE AND METHOD THEREOF

FIELD OF THE INVENTION

The present invention relates to a touch control device and a scanning method thereof, and in particular to a capacitive touch control device that employs alternate driving and scanning operations, and a method thereof.

BACKGROUND OF THE INVENTION

Touch panels have been of wide applications in the fields of household appliances, communications, and electronic information appliances. The common application of the touch panel is an input interface, for example a personal digital assistant (PDA), an electrical appliance, or a game machine. With the integration of the touch panel with a display, a user is allowed to use his or her finger or a stylus to point a control icon shown on a screen in order to enter a desired operation on for example a PDA, an electrical appliance or a game machine. Further, the touch panel is also applied in a public information inquiry system to provide an efficient operation system for the public.

A conventional touch panel comprises a substrate having a surface on which sensing zones are distributed for sensing a signal associated with the touch of a user's finger or stylus to achieve control by touch. The sensing zones are made of transparent conductive membranes, such as ITO, whereby a user may touch the transparent conducive membrane corresponding to a specific location displayed on the display panel to achieve control by touch.

The most commonly known types of touch control techniques include resistive panel, capacitive panel, infrared sensing panel, electromagnetic sensing panel, and sonic sensing panel. The operation of the capacitive touch panel is performed by employing a change in capacitance caused between a transparent electrode and the electrostatics of human body to induce an electrical current based on which the coordinates of a touch location can be identified. The capacitive touch panel is advantageous in light transmittance, hardness, precision, response time, touch cycles, operation temperature and initial force, and is thus most commonly used currently.

SUMMARY OF THE INVENTION

All the known patent techniques disclose a function of detecting a user touching a touch panel and all the known touch panels are comprised of a structure of distributed arrangement of touch sensing elements. However, these known devices are mostly of a construction including two capacitive sensing layers spaced from each other with an insulation material to provide capacitive effect between the layers. In using a touch pane of such as design, although the function of capacitive touch control can be realized, yet the structure of the panel is very thick, which is against the trend of miniaturization. Further, the conventional capacitive touch panel comprises a substrate on both surfaces of which capacitive sensing layers are formed respectively. A circuit connection process including holes, vias, and circuit laying must be employed to properly connect electrodes of the sensing layers. This complicates the manufacturing of the capacitive touch panel.

Thus, an objective of the present invention is to provide a thin touch control pattern structure of a capacitive touch panel, wherein the touch control pattern structure consists of a first electrode group and a second electrode group, each being comprised of a plurality of electrodes that is interconnected through leads and is parallel to each other.

Another objective of the present invention is to provide a touch control pattern structure of a capacitive touch panel that can be manufactured with a simple process, wherein the electrodes of the first and second electrode groups of the touch control pattern structure and the lead are formed on the same surface of the structure by using a regular transparent conductive layer forming process.

A further objective of the present invention is to provide a method that employs alternate driving and scanning to detect a touch location, wherein when the electrodes of the first electrode group are driven, the electrodes of the second electrode group are scanned and when the electrodes of the second electrode group are driven, the electrodes of the first electrode group are scanned.

According to the present invention, a solution to overcome the above discussed drawbacks of the conventional capacitive touch panels resides in that a top face of a substrate is provided with first and second electrode groups, which each include a plurality of strip-like electrodes parallel to and spaced from each other by a preset distance. The electrodes of the first and second electrode groups are respectively connected by first and second group scanning lines to a scanning circuit for connection with a micro processor. When the first group scanning lines drive the electrodes of the first electrode group, the second group scanning lines carry out scanning operation on the electrodes of the second electrode group, and when the second group scanning lines drive the electrodes of the second electrode group, the first group scanning lines carry out scanning operation on the electrodes of the first electrode group.

In accordance with the technical solution of the present invention, the electrodes of the first electrode group and the second electrode group can be arranged on the same surface of a substrate, which together with a process of detecting a touch location by an alternate driving and scanning operation, can realize simplification of structure and reduction of structure thickness. In manufacturing of the electrodes and leads of the first electrode group and the second electrode group of the touch control pattern structure, a circuit laying process only needs to be applied to a single surface of the substrate to complete a desired touch control pattern structure. Thus, the present invention provides advantages of at least easy manufacturing, good passing rate, and low costs in industrial utilization.

A preferred embodiment that is adopted in the present invention will be further described with respect to the following example, reference being had to the drawings.

BRIEF DESCRIPTION OF THE DRAWINGS

FIG. 6 illustrates a table indicating "driving" and "scanning" operations of the electrodes within different time intervals under a single-end sequential scanning mode.

DETAILED DESCRIPTION OF THE PREFERRED EMBODIMENTS

Figure 1:
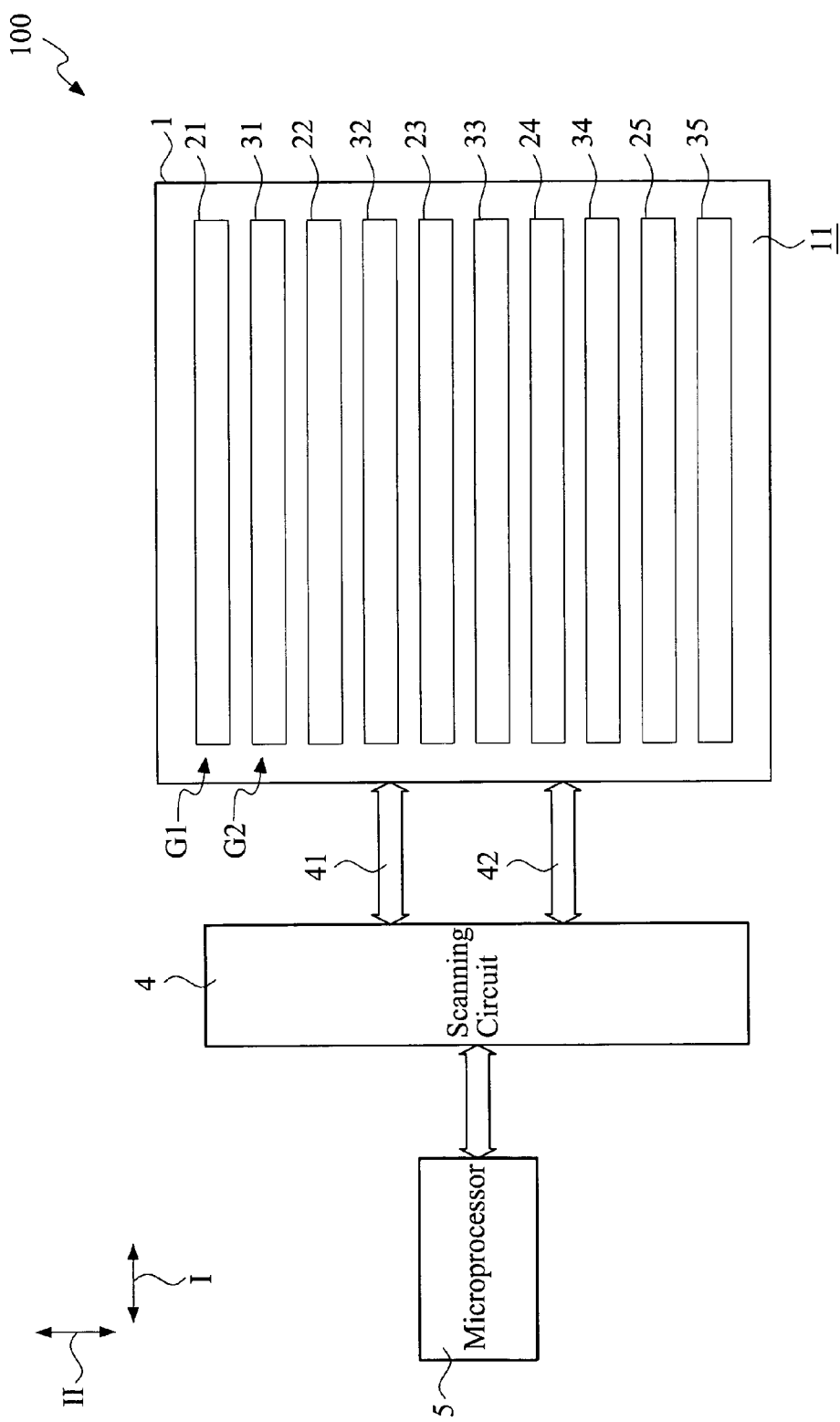
FIG. 1 illustrates a schematic plan view of a touch control device constructed in accordance with a first embodiment of the present invention.

With reference to the drawings and in particular to FIG. 1, which illustrates a schematic plan view of a touch control device constructed in accordance with a first embodiment of the present invention, the touch control device in accordance with the present invention, generally designated at 100, comprises a substrate 1 having a touch control operation surface 11. Arranged on the touch control operation surface 11 of the substrate 1 are a first electrode group G1 and a second electrode group G2. In the present embodiment, the first electrode group G1 contains a plurality of strip-like electrodes 21, 22, 23, 24, 25, which are spaced from each other by a preset distance that defines an interval area.

The second electrode group G2 contains a plurality of electrodes 31, 32, 33, 34, 35, which are parallel to the electrodes 21, 22, 23, 24, 25 of the first electrode group G1. The electrodes 31, 32, 33, 34, 35 of the second electrode group G2 are respectively set in the interval areas between the electrodes 21, 22, 23, 24, 25 of the first electrode group G1. In the present embodiment, the number of the electrodes contained in each of the first electrode group G1 and the second electrode group G2 is five. However, it is apparent to those having ordinary skills in the art that the number of the electrodes for each of the electrode groups is not limited to the specific number.

The first electrode group G1 and the second electrode group G2 are respectively connected to a microprocessor 5 via first group scanning lines 41 that are connected to a scanning circuit 4 and second group scanning lines 42 that are connected to the scanning circuit 4.

Figure 2:
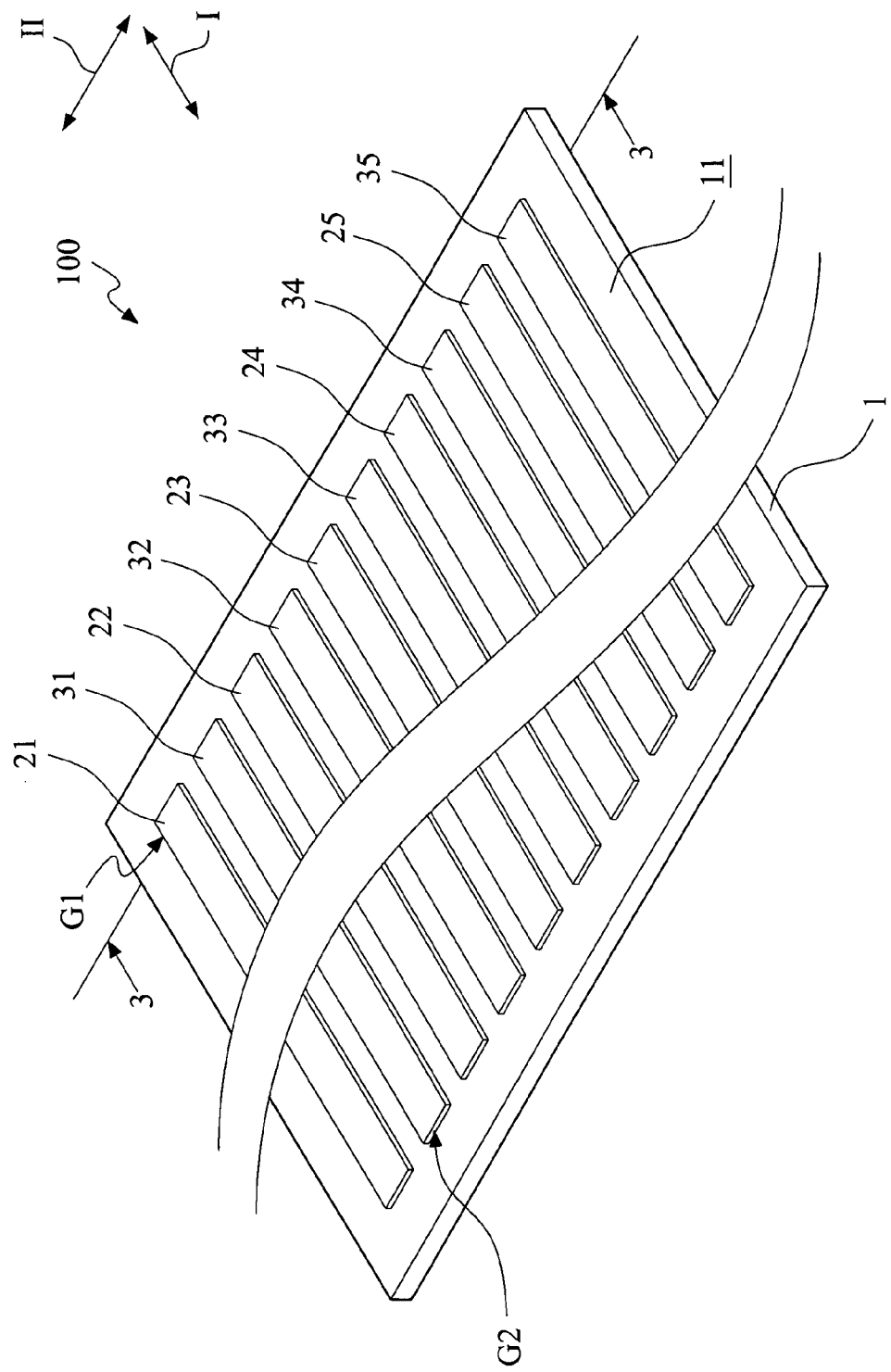
FIG. 2 illustrates a local perspective view of a touch control pattern structure that forms the first embodiment touch control device in accordance with the present invention.
Figure 3:
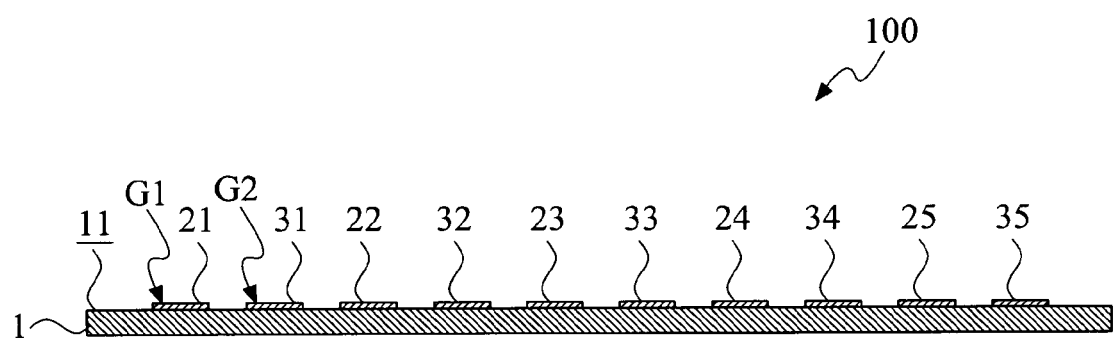
FIG. 3 illustrates a cross-sectional view taken along line 3-3 of FIG. 2.

Also referring to FIGS. 2 and 3, FIG. 2 illustrates a local perspective view of a structure of a touch control pattern that forms the first embodiment touch control device in accordance with the present invention, and FIG. 3 is a cross-sectional view taken along line 3-3 of FIG. 2.

As shown in the drawings, the electrodes 21, 22, 23, 24, 25 of the first electrode group G1 and the electrodes 31, 32, 33, 34, 35 of the second electrode group G2 are set to extend in a first axial direction I and are sequentially and alternately arranged along a second axial direction II. The electrodes 21, 22, 23, 24, 25, 31, 32, 33, 34, 35 of the first and second electrode groups G1 and G2 are made of transparent conductive materials, such as ITO that is conventionally used.

Figure 4:
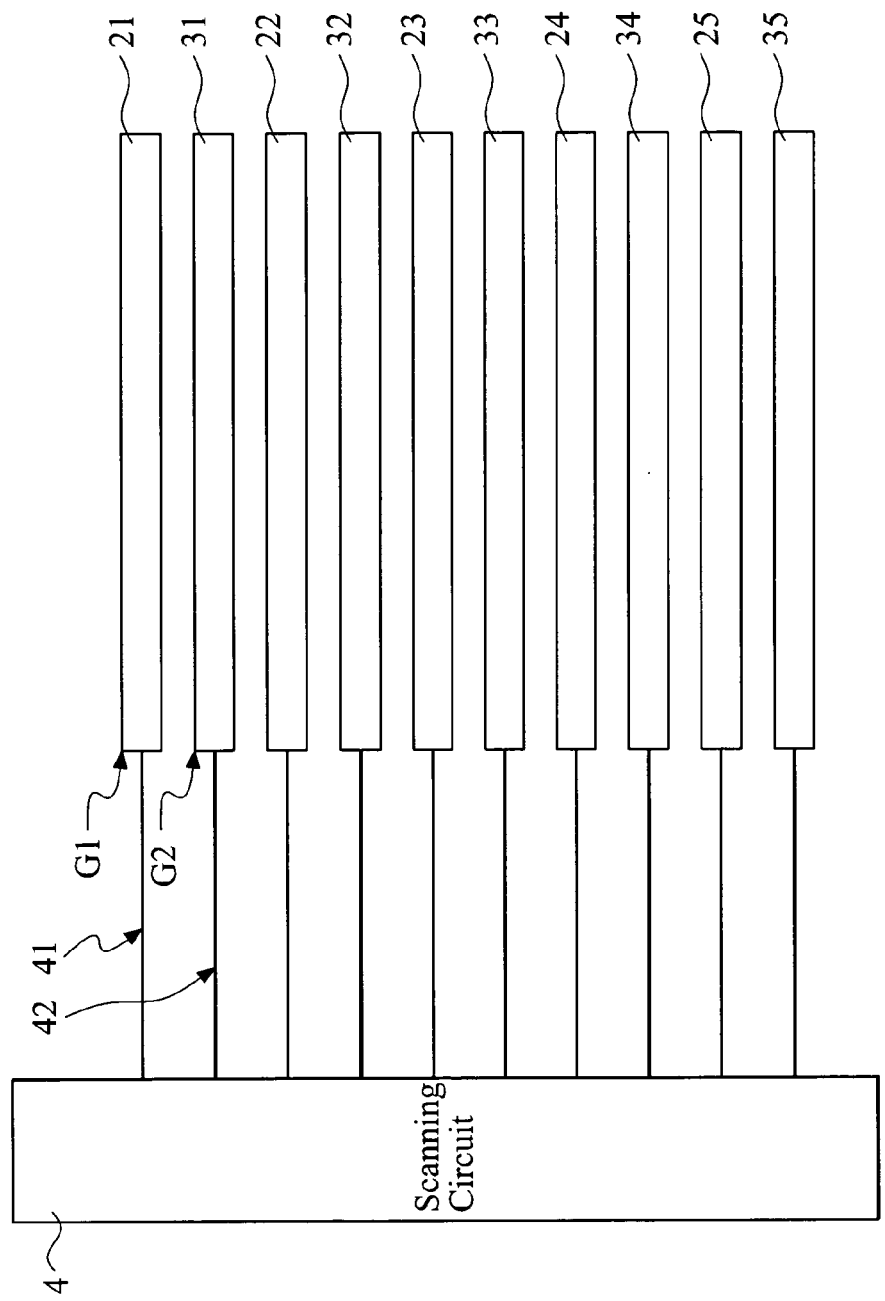
FIG. 4 illustrates a schematic circuit diagram of the touch control pattern structure of the first embodiment touch control device in accordance with the present invention.

Referring to FIG. 4, which shows a schematic circuit diagram of the structure of the touch control pattern of the first embodiment touch control device in accordance with the present invention, as shown, in the first electrode group G1, an electrode, of which electrode 21 is taken as an example for the following explanation, has an end connected to the scanning circuit 4 via the first group scanning lines 41. In the second electrode group G2, an electrode, of which electrode 31 is taken as an example for the following explanation, has an end connected to the scanning circuit 4 via the second group scanning lines 42. The remaining electrodes 22, 23, 24, 25, 32, 33, 34, 35 are also put in connection in a similar way, so that further description is not necessary here. The first group scanning lines 41 and the second group scanning lines 42 are made of transparent conductive materials.

The first group scanning lines 41 and the second group scanning lines 42 are of the functions of "driving" and "scanning" as are employed in the conventional capacitive touch control device, and in the present embodiment, the first group scanning lines 41 and the second group scanning lines 42 are operated to carry out alternate driving and scanning operations. When the first group scanning lines 41 are operated to carry out driving operation on the electrodes 21, 22, 23, 24, 25 of the first electrode group G1, the second group scanning lines 42 carry out scanning operation on the electrodes 31, 32, 33, 34, 35 of the second electrode group G2; and when the second group scanning lines 42 are operated to carry out driving operation on the electrodes 31, 32, 33, 34, 35 of the second electrode group, the first group scanning lines carry out scanning operation on the electrodes 21, 22, 23, 24, 25 of the first electrode group, in order to detect a touch location of the touch control device 100.

Figure 5:
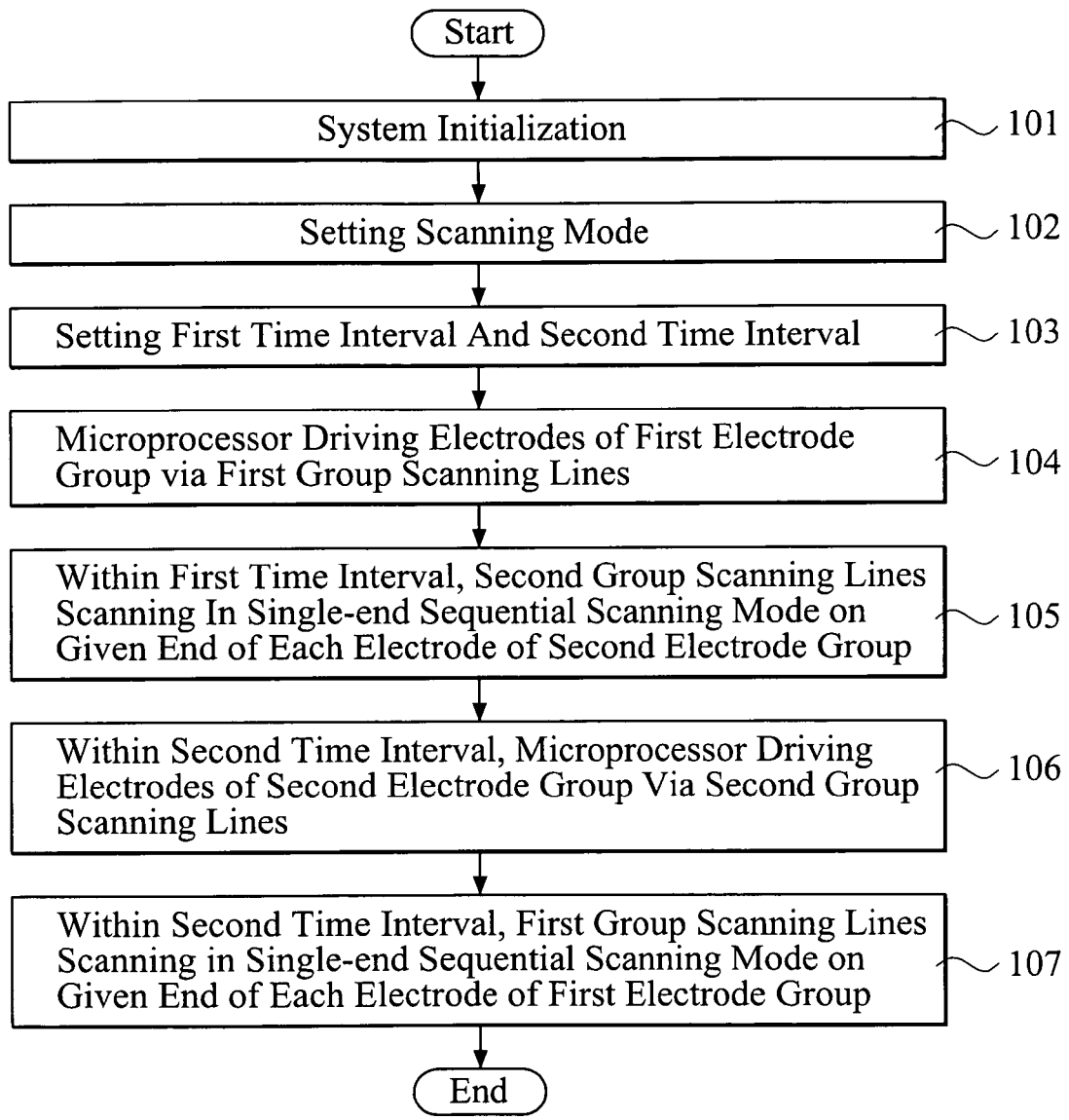
FIG. 5 illustrates a flow chart of an operation of the touch control device in accordance with the first embodiment of the present invention.

FIG. 5 shows a flow chart of the operation of the touch control device in accordance with the first embodiment of the present invention. As shown, the operation flow of the present embodiment begins with system initialization (step 101).

Then, a step of setting scanning mode (step 102) follows. The present embodiment includes a single-end sequential scanning mode, and further description will be given for explanation with reference to such a scanning mode. The following steps will be explained with additional reference to FIG. 6, which shows a table indicating "driving" and "scanning" operations of the electrodes within different time intervals under the single-end sequential scanning mode.

The next step is to set a first time interval t1 and a second time interval t2 (step 103).

Within the first time interval t1, the microprocessor 5 employs the first group scanning lines 41 to drive the electrodes 21, 22, 23, 24, 25 of the first electrode group G1 by imposing a driving voltage thereto (step 104).

Meanwhile, also within the first time interval t1, the second group scanning lines 42 carries out scanning operation in the single-end sequential scanning mode on a given end of each electrode 31, 32, 33, 34, 35 of the second electrode group G2, such as end 31*a*, 32*a*, 33*a*, 34*a*, 35*a* (step 105).

Within the second time interval t2, the microprocessor 5 employs the second group scanning lines 42 to drive the electrodes 31, 32, 33, 34, 35 of the second electrode group G2 (step 106).

Also within the second time interval t2, the first group scanning lines 41 carries out scanning operation in the single-end sequential scanning mode on a given end of each electrode 21, 22, 23, 24, 25 of the first electrode group G1, such as end 21*a*, 22*a*, 23*a*, 24*a*, 25*a* (step 107).

With such steps repeatedly performed, the microprocessor 5 can calculate out coordinates of a touch location based on a divided voltage detected at each electrode 21, 22, 23, 24, 25, 31, 32, 33, 34, 35.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A capacitive touch control device comprising:
    a substrate having a capacitive touch control operation surface;
    a first electrode group comprising a plurality of strip-like electrodes arranged on the capacitive touch control operation surface of the substrate and respectively connected to first group scanning lines connected to a scanning circuit, the electrodes being spaced from each other by a preset distance, which defines an interval area;

a second electrode group comprising a plurality of strip-like electrodes respectively arranged in the interval areas between the electrodes of the first electrode group and respectively connected to second group scanning lines connected to a scanning circuit;

wherein, in a first time interval, when the first group scanning lines impose a driving voltage to the electrodes of the first electrode group and also within the first time interval the second group scanning lines carry out scanning operation by detecting voltage on the electrodes of the second electrode group, and in a second time interval, wherein when the second group scanning lines impose a driving voltage to the electrodes of the second electrode group and also within the second time interval the first group scanning lines carry out scanning operation by detecting voltage on the electrodes of the first electrode group;

wherein the electrodes of the second electrode group are parallel to the electrodes of the first electrode group.

2. The capacitive touch control device as claimed in claim 1, wherein the electrodes of the first electrode group and the second electrode group are made of transparent conductive materials.

3. The capacitive touch control device as claimed in claim 1, wherein the first group scanning lines and the second group scanning lines are made of transparent conductive materials.

4. A scanning method of a capacitive touch control device for detecting a touch location of the touch control device, the touch control device comprising a substrate having a capacitive touch control operation surface on which first and second electrode groups are arranged, the first electrode group comprising a plurality of strip-like electrodes respectively connected to first group scanning lines connected to a scanning circuit, the electrodes being spaced from each other by a preset distance, which defines an interval area, the second electrode group comprising a plurality of strip-like electrodes respectively arranged in the interval areas between the electrodes of the first electrode group and respectively connected to second group scanning lines connected to a scanning circuit, the method comprising the following steps:

(a) within a first time interval, at the same time, using the first group scanning lines to impose a driving voltage to each electrode of the first electrode group and using the second group scanning lines to carry out scanning operation by detecting voltage in a given scanning mode on each electrode of the second electrode group;

(b) within a second time interval, at the same time, using the second group scanning lines to impose a driving voltage to each electrode of the second electrode group and using the first group scanning lines to carry out scanning operation by detecting voltage in the given scanning mode on each electrode of the first electrode group;

(e) repeating steps (a), (b) to obtain a touch location;

wherein the electrodes of the second electrode group are parallel to the electrodes of the first electrode group.

5. The method as claimed in claim 4, wherein in step (a), the given scanning mode comprise using the second group scanning lines to carry out a sequential scanning operation by detecting voltage on an end of each electrode of the second electrode group.

6. The method as claimed in claim 4, wherein in step (b), the given scanning mode comprise using the first group scanning lines to carry out a sequential scanning operation by detecting voltage on an end of each electrode of the first electrode group.

* * * * *